(12) United States Patent
Diehl et al.

(10) Patent No.: US 11,056,277 B2
(45) Date of Patent: Jul. 6, 2021

(54) MAGNETIZED SUBSTRATE CARRIER APPARATUS WITH SHADOW MASK FOR DEPOSITION

(71) Applicant: APPLIED MATERIALS, INC., Santa Clara, CA (US)

(72) Inventors: Daniel Lee Diehl, Chiba (JP); Alexander Lerner, San Jose, CA (US); Roey Shaviv, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 13 days.

(21) Appl. No.: 16/289,328

(22) Filed: Feb. 28, 2019

(65) Prior Publication Data

US 2020/0211769 A1    Jul. 2, 2020

Related U.S. Application Data

(60) Provisional application No. 62/785,786, filed on Dec. 28, 2018.

(51) Int. Cl.
| | |
|---|---|
| *H01F 41/34* | (2006.01) |
| *C23C 14/04* | (2006.01) |
| *H01F 41/18* | (2006.01) |
| *B32B 3/00* | (2006.01) |

(52) U.S. Cl.
CPC ........... *H01F 41/34* (2013.01); *C23C 14/042* (2013.01); *H01F 41/18* (2013.01); *B32B 3/00* (2013.01)

(58) Field of Classification Search
CPC ..... Y10T 428/24008; Y10T 428/24331; C23C 14/50; C23C 14/042; H01L 43/34
See application file for complete search history.

(56) References Cited

U.S. PATENT DOCUMENTS

| | | |
|---|---|---|
| 9,527,098 B2 | 12/2016 | Hirobe et al. |
| 2007/0159065 A1 | 7/2007 | Yan et al. |
| 2010/0163404 A1 | 7/2010 | De et al. |
| 2014/0252380 A1 | 9/2014 | Lee et al. |
| 2014/0264732 A1 | 9/2014 | Elsherbini et al. |
| 2016/0260902 A1 | 9/2016 | Sonoda et al. |
| 2017/0342543 A1 | 11/2017 | Ghosh et al. |
| 2019/0352765 A1* | 11/2019 | Ono ............... C23C 14/042 |

FOREIGN PATENT DOCUMENTS

JP    2018127705 A  *  8/2018  ............. H05B 33/10

OTHER PUBLICATIONS

PCT International Search Report and Written Opinion for PCT/US2019/066845 filed Apr. 29, 2020.

\* cited by examiner

*Primary Examiner* — Alexander S Thomas
(74) *Attorney, Agent, or Firm* — Moser Taboada (57) ABSTRACT

Methods and apparatus for a magnetized substrate carrier apparatus are described herein. In some embodiments, a substrate carrier apparatus includes: a carrier plate having a support surface to support a substrate, a mask assembly disposed above the support surface, wherein the mask assembly includes an annular frame and a shadow mask disposed within the annular frame, and wherein the shadow mask includes one or more openings arranged in a predetermined pattern and disposed through the shadow mask, and one or more magnets disposed on or embedded within at least one of the carrier plate and the shadow mask to create a magnetic field above the support surface.

20 Claims, 4 Drawing Sheets

MAGNETIZED SUBSTRATE CARRIER APPARATUS WITH SHADOW MASK FOR DEPOSITION

CROSS-REFERENCE TO RELATED APPLICATIONS

This application claims benefit of U.S. provisional patent application Ser. No. 62/785,786, filed Dec. 28, 2018, which is herein incorporated by reference in its entirety.

FIELD

Embodiments of the present disclosure generally relate to substrate processing systems, and more specifically to a magnetized substrate carrier apparatus.

BACKGROUND

In the fabrication of modern electronic devices, the increasing device density and decreasing device dimensions demand more stringent requirements in the packaging or interconnecting techniques of such high density devices. Generally, the fabrication of modern electronics involves wafer level packaging. Wafer level packaging may include fan-in and fan-out techniques of creating an inductor for providing internal and external device connectivity such as, for example, wireless charging and chip-to-chip communication. Creating the inductors typically involves the use of a polymer material having dielectric properties and an inductor disposed within the polymer material.

The inventors have developed a simplified apparatus and methods to fabricate magnetic uniaxial inductors and magnetic inductors with magnetic domains aligned in more than one direction.

SUMMARY

Methods and apparatus for a magnetized substrate carrier apparatus are described herein. In some embodiments, a substrate carrier apparatus includes a carrier plate having a support surface to support a substrate, a mask assembly disposed above the support surface, wherein the mask assembly includes an annular frame and a shadow mask disposed within the annular frame, and wherein the shadow mask includes one or more openings arranged in a predetermined pattern and disposed through the shadow mask, and one or more magnets disposed on or embedded within at least one of the carrier plate and the shadow mask to create a magnetic field above the support surface.

In some embodiments, a process chamber includes a chamber body covered by a lid, a target disposed within the chamber body adjacent the lid, a substrate support disposed within the chamber body opposite the target, and a substrate carrier apparatus retained on the substrate support, wherein the substrate carrier apparatus includes a carrier plate having a support surface to support a substrate and a shadow mask disposed above the carrier plate, and wherein one or more magnets are disposed on or embedded within the substrate carrier apparatus to create a magnetic field above the support surface.

In some embodiments, a method of forming an inductor includes placing a substrate onto a carrier plate, placing a shadow mask over the substrate in a mask chamber, moving the substrate and a substrate carrier apparatus comprising the carrier plate and the shadow mask into a deposition chamber, wherein the substrate carrier apparatus includes one or more magnets to create a magnetic field, and depositing magnetic material onto the substrate, wherein the magnetic field is configured to align magnetic domains of the magnetic material in a desired orientation as the magnetic material is being deposited.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a magnetized substrate carrier apparatus.are provided herein. The magnetized substrate carrier apparatus advantageously facilitates patterning inductors, for example, uniaxial inductors or toroid shaped inductors, during deposition of magnetic materials in a deposition chamber while also orienting magnetic domains of the magnetic materials used in manufacturing such inductors during deposition. The magnetized substrate carrier apparatus includes a shadow mask and a carrier plate, either or both of which can be advantageously magnetized to pattern inductors and orient the magnetic material in the desired directions. The magnetized substrate carrier apparatus advantageously eliminates costly post deposition etching and annealing processes to form an inductor. The magnetized substrate carrier apparatus is configured to align the magnetic domains of the magnetic material as the magnetic material is being deposited onto a substrate. Aligning the magnetic domains of particles of the magnetic material during the deposition process advantageously uses less energy than aligning the magnetic domains of the magnetic material once deposition is complete and the inductor is formed.

Figure 1:
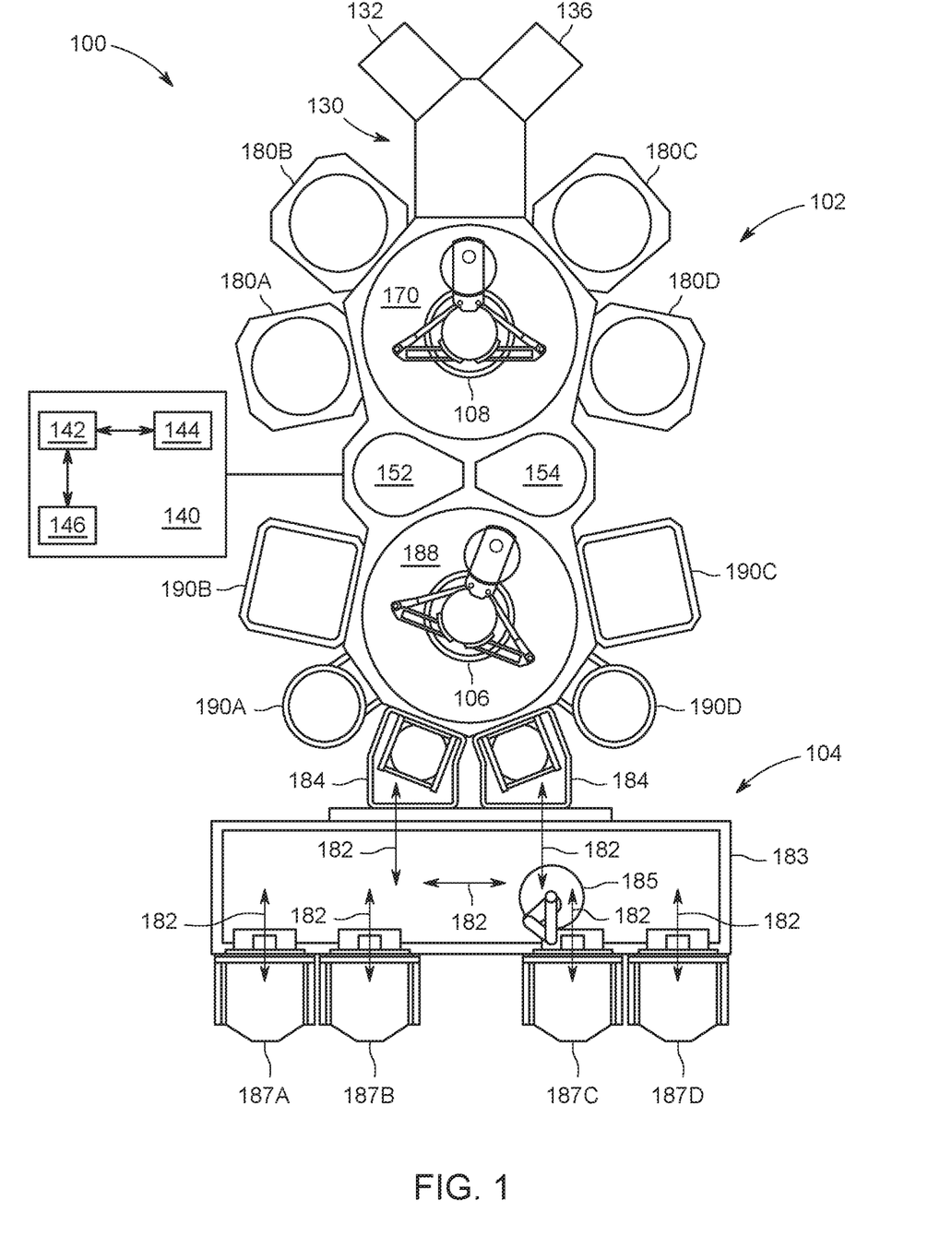
FIG. 1 depicts a processing system suitable for use with a magnetized substrate carrier apparatus in accordance with some embodiments of the present disclosure.

FIG. 1 shows a schematic top-view diagram of an exemplary multi-chamber processing system 100 that may be suitable for use with a magnetized substrate carrier apparatus in accordance with some embodiments of the present disclosure. Examples of suitable multi-chamber processing systems that may be suitably modified in accordance with the teachings provided herein include the ENDURA® and CENTURA® processing systems or other suitable processing systems commercially available from Applied Materials, Inc., located in Santa Clara, Calif. Other processing systems (including those from other manufacturers) may be adapted to benefit from the embodiments disclosed herein.

In some embodiments, the multi-chamber processing system 100 may generally comprise a processing platform 102 that is vacuum-tight, a factory interface 104, and a system controller 140. The processing platform 102 may include at least one load-lock chamber 184 (two shown) for transferring substrates into and out of the processing platform 102. A first robot 106 may transfer the substrates between the load lock chambers 184 and a first set of one or more process chambers 190A-190D (four are shown) coupled to a first transfer chamber 188. The process chambers 190A-190D may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes. Each of the process chambers 190A-190D may include a slit valve or other selectively sealable opening to selectively fluidly couple the respective inner volumes of the process chambers 190A-190D to the inner volume of the first transfer chamber 188. Similarly, each load lock chamber 184 may include a port to selectively fluidly couple the respective inner volumes of the load lock chambers 184 to the inner volume of the first transfer chamber 188.

The first robot 106 can also transfer substrates to/from two intermediate transfer chambers 152, 154. The intermediate transfer chambers 152, 154 can be used to maintain ultrahigh vacuum conditions while allowing substrates to be transferred within the processing platform 102. A second robot 108 can transfer the substrates between the intermediate transfer chambers 152, 154 and a second set of one or more process chambers 180A-180D coupled to a second transfer chamber 170. The process chambers 180A-180D may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes. Each of the process chambers 180A-198D may include a slit valve or other selectively sealable opening to selectively fluidly couple the respective inner volumes of the process chambers 180A-180D to an inner volume of the second transfer chamber 170. The process chambers 190A-190D and the process chambers 180A-180D can be outfitted to perform a variety of substrate processing operations including the method 500

The second robot 108 can transfer the substrates between the intermediate transfer chambers 152, 154 and an alignment and mask storage chamber 130 coupled to the second transfer chamber 170. The alignment and mask storage chamber 130 may include a slit valve or other selectively sealable opening to selectively fluidly couple an inner volume of the alignment and mask storage chamber 130 to the inner volume of the second transfer chamber 170. In some embodiments, the alignment and mask storage chamber 130 may include one or more stations such as an alignment station 132 and a mask stocker station 136. The mask stocker station 136 includes a mask holder configured to hold one or more shadow masks having similar patterns or different patterns. In some embodiments, a shadow mask is taken from the mask stocker station and installed above a substrate and carrier plate. The alignment station 132 is configured to align the substrate, the shadow mask, and the carrier plate.

The factory interface 104 is coupled to the first transfer chamber 188 via the load lock chambers 184. In some embodiments, each of the load lock chambers 184 may include a first port coupled to the factory interface 104 and a second port coupled to the first transfer chamber 188. The load lock chambers 184 may be coupled to a pressure control system which pumps down and vents the load lock chambers 184 to facilitate passing the substrate between the vacuum environment of the first transfer chamber 188 and the substantially ambient (e.g., atmospheric) environment of the factory interface 104.

In some embodiments, the factory interface 104 comprises at least one docking station 183 and at least one factory interface robot 185 (one shown) to facilitate transfer of substrates from the factory interface 104 to the processing platform 102 for processing through the load lock chambers 184. The docking station 183 is configured to accept one or more (four shown) front opening unified pods (FOUPs) 187A-D. Optionally, one or more metrology stations (not shown) may be coupled to the factory interface 104 to facilitate measurement of the substrate from the FOUPs 187A-D. The factory interface robot 185 disposed in the factory interface 104 is capable of linear and rotational movement (arrows 182) to shuttle cassettes of substrates between the load lock chambers 184 and the one or more FOUPs 187A-D.

The system controller 140 includes a central processing unit (CPU) 142, a memory 144, and support circuits 146. The system controller 140 may control the multi-chamber processing system 100 directly, or via computers (or controllers) associated with particular process chambers and/or support system components. The controller 440 may be any form of general purpose computer processor that can be used in an industrial setting for controlling various chambers and sub-processors. The memory, or computer readable medium, 142 of the system controller 140 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 146 are coupled to the CPU 142 for supporting the processor in a conventional manner.

Figure 2:
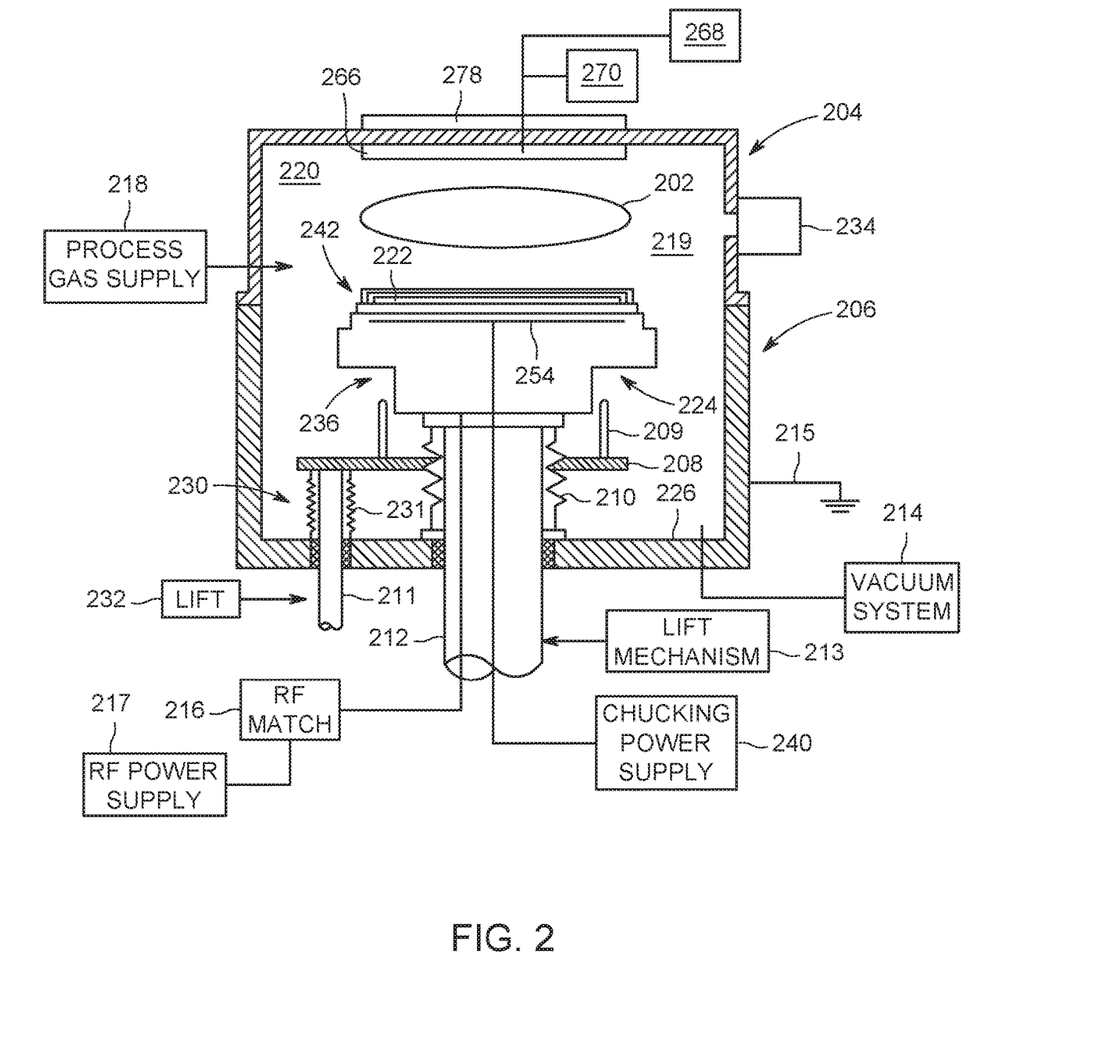
FIG. 2 depicts a deposition chamber in accordance with some embodiments of the present disclosure.

FIG. 2 is a schematic cross-sectional view of process chamber (e.g., a plasma processing chamber) in accordance with some embodiments of the present disclosure. In some embodiments, the plasma processing chamber is a physical vapor deposition (PVD) processing chamber. However, other types of processing chambers configured for different processes can also use or be modified for use with embodiments of the magnetized substrate carrier apparatus.

In some embodiments, a chamber 200 may be one of the process chambers 190A-B. The chamber 200 is a vacuum chamber which is suitably adapted to maintain sub-atmospheric pressures within a chamber interior volume 220 during substrate processing. The chamber 200 includes a chamber body 206 covered by a lid 204 which encloses a processing volume 219 located in an upper portion of chamber interior volume 220. A slit valve 234 is coupled to the chamber body 206 and configured to facilitate transfer of a substrate 222 into and out of the chamber 200. The chamber body 206 and lid 204 may be made of metal, such as aluminum. The chamber body 206 may be grounded via a coupling to ground 215.

A substrate support 224 is disposed within the chamber interior volume 220 to support and retain a magnetized substrate carrier apparatus 242 and the substrate 222, such as a semiconductor wafer, for example. The substrate support 224 may generally comprise a pedestal 236 that includes a dielectric body having one or more electrodes 254 disposed therein and a hollow support shaft 212 for supporting the pedestal 236. The hollow support shaft 112 provides a conduit to provide, for example, gases, fluids, coolants, power, or the like, to the pedestal 236.

In some embodiments, the hollow support shaft 212 is coupled to a lift mechanism 213, such as an actuator or motor, which provides vertical movement of the electrostatic chuck 250 between an upper, processing position (as shown in FIG. 2) and a lower, transfer position (not shown). A bellows assembly 210 is disposed about the hollow support shaft 212 and is coupled between the pedestal 236 and a bottom surface 226 of chamber 200 to provide a flexible seal that allows vertical motion of the pedestal 236 while preventing loss of vacuum from within the chamber 200.

The hollow support shaft 212 provides a conduit for coupling a chucking power supply 240 and RF sources (e.g., RF plasma power supply 270 and RF bias power supply 217) to the pedestal 236. In some embodiments, RF plasma power supply 270 and RF bias power supply 217 are coupled to the electrostatic chuck via respective RF match networks (only RF match network 216 shown). In some embodiments, the substrate support may alternatively include AC, DC, or RF bias power.

A substrate lift 230 can include lift pins 209 mounted on a platform 208 connected to a shaft 211 which is coupled to a second lift mechanism 232 for raising and lowering the substrate lift 230 so that the magnetized substrate carrier apparatus 242 and the substrate 222 may be placed on or removed from the pedestal 236. The pedestal 236 includes thru-holes to receive the lift pins 209. A bellows assembly 231 is coupled between the substrate lift 230 and bottom surface 226 to provide a flexible seal which maintains the chamber vacuum during vertical motion of the substrate lift 230.

The chamber 200 is coupled to and in fluid communication with a vacuum system 214 which includes a throttle valve (not shown) and vacuum pump (not shown) which are used to exhaust the chamber 200. The pressure inside the chamber 200 may be regulated by adjusting the throttle valve and/or vacuum pump. The chamber 200 is also coupled to and in fluid communication with a process gas supply 218 which may supply one or more process gases to the chamber 200 for processing a substrate disposed therein. In some embodiments, the process gas includes a sputtering gas such as argon (Ar), neon (Ne), or krypton (Kr).

In operation, for example, a plasma 202 may be created in the chamber interior volume 220 to perform one or more processes. The plasma 202 may be created by coupling power from a plasma power source (e.g., RF plasma power supply 270) to a process gas to ignite the process gas and create the plasma 202. In some embodiments, a bias power may also be provided from a bias power supply (e.g., RF bias power supply 217) to one or more electrodes 254 within the pedestal 236 to attract ions from the plasma towards the substrate 222. In some embodiments, a portable electrostatic chuck may be used, which may not require the use of a bias power. The electrostatic chuck may have a particular thickness above the electrode. Alternatively, the specification may set forth an acceptable thickness of the electrostatic chuck.

In some embodiments, for example where the chamber 200 is a PVD chamber, a target 266 comprising a source material to be deposited on a substrate 122 may be disposed above the substrate and within the chamber interior volume 120. The target 266 may be supported by a grounded conductive portion of the chamber 200, for example an aluminum adapter through a dielectric isolator. In other embodiments, the chamber 200 may include a plurality of targets in a multi-cathode arrangement for depositing layers of different material using the same chamber.

A controllable DC power source 268 may be coupled to the chamber 200 to apply a negative voltage, or bias, to the target 266. The RF bias power supply 217 may be coupled to the substrate support 224 in order to induce a negative DC bias on the substrate 222. In addition, in some embodiments, a negative DC self-bias may form on the substrate 222 during processing. In some embodiments, an RF plasma power supply 270 may also be coupled to the chamber 200 to apply RF power to the target 266 to facilitate control of the radial distribution of a deposition rate on substrate 222. In operation, ions in the plasma 202 created in the chamber 200 react with the source material from the target 266. The reaction causes the target 266 to eject atoms of the source material, which are then directed towards the substrate 222, thus depositing material. The deposited material may be a magnetic material. For example, the deposited material may be one or more of iron (Fe), nickel (Ni), nickel-iron (NiFe), aluminum-nickel-cobalt (AlNiCo), cobalt-tantalum-zirconium (CoTaZr), cobalt-niobium-zirconium (CoNbZr), cobalt-zirconium oxide ($CoZrO_2$), iron-hafnium nitride (FeHfN), cobalt-iron-hafnium oxide (CoFeHfO), or the like.

In some embodiments, the chamber 200 further includes a magnetron assembly 278. The magnetron assembly 278 provides a rotating magnetic field proximate the target 266 to assist in plasma processing within the chamber 200. In some embodiments, the magnetron assembly 278 includes a plurality of magnets that rotate about a central axis of the chamber 200.

The substrate carrier apparatus includes a carrier plate on which a substrate can be placed and a mask assembly which can be placed atop the carrier such that a shadow mask of the mask assembly is disposed above the substrate. The shadow mask is a hard mask. The substrate carrier apparatus advantageously enables the placement and removal of the hard mask above the substrate in a vacuum environment. For example, a chamber configured to receive the substrate on the carrier plate and place/remove the mask assembly above the substrate may be coupled to a cluster tool, such as the multi-chamber processing system 100, so that the mask assembly is always in a vacuum environment. As a result, particle generation on the hard mask is advantageously minimized or substantially eliminated, which prevents contamination of substrates and processing chambers which come into contact with the hard mask.

One or more magnets are disposed on at least one of the carrier plate and the shadow mask to magnetize the substrate carrier apparatus. The magnetized substrate carrier apparatus is advantageously configured to align the magnetic domains of magnetic material in a desired direction as the magnetic material is being deposited onto the substrate. The one or more magnets are configured to create a magnetic field between an upper surface of the shadow mask and an upper surface of the substrate having a strength that is suitable for orienting the magnetic domains of the magnetic material. In some embodiments, the magnetized substrate carrier apparatus provides a magnetic field at a substrate surface level that is strong enough to negate the effect of any magnets in a magnetron assembly. In some embodiments, the one or more magnets provide a magnetic field strength at a substrate surface level above the support surface of about 10 Oersteds to about 5000 Oersteds, or about tens to hundreds of Oersteds. The magnetized substrate carrier apparatus is advantageously configured to align the magnetic domains of the magnetic material already deposited, while additional magnetic material is being deposited. In some embodiments, the magnetic field is substantially perpendicular to the support surface at the substrate surface level above the support surface. In some embodiments, the magnetic field is substantially parallel to the support surface at the substrate surface level above the support surface.

Figure 3:
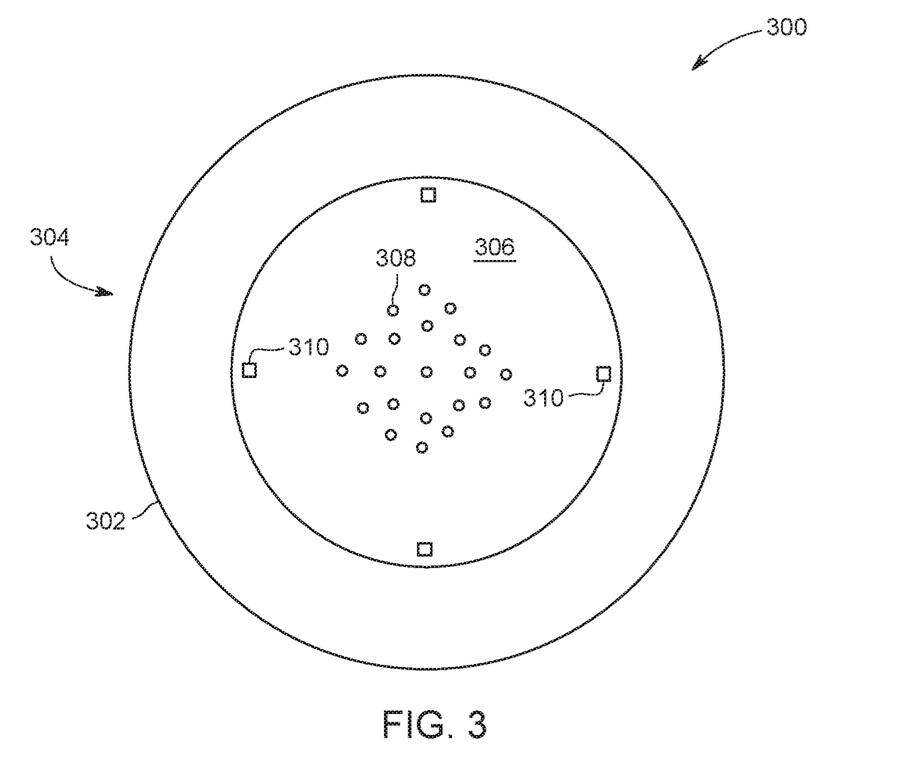
FIG. 3 depicts a schematic top view of a substrate carrier apparatus in accordance with some embodiments of the present disclosure.
Figure 4:
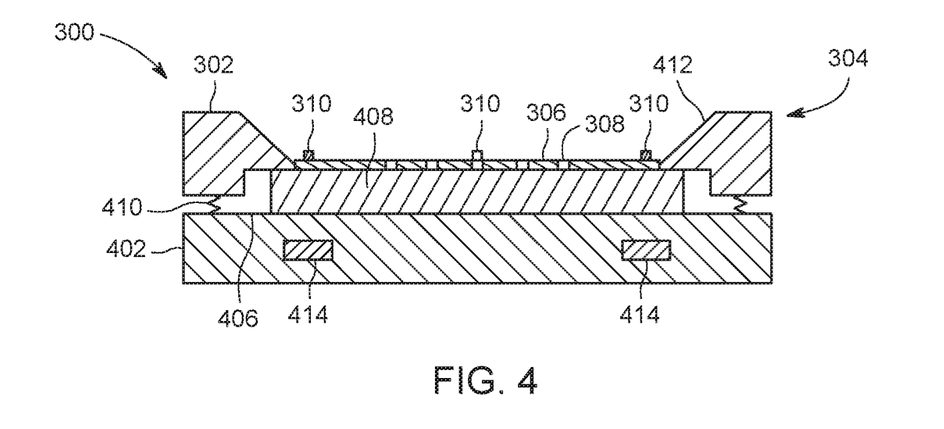
FIG. 4 depicts a cross-sectional view of a substrate carrier apparatus in accordance with some embodiments of the present disclosure.

The following description will be made with reference to FIGS. 3 and 4. FIG. 3 depicts a schematic top view of a substrate carrier apparatus in accordance with some embodiments of the present disclosure. FIG. 4 depicts a cross-sectional view of a substrate carrier apparatus in accordance with some embodiments of the present disclosure.

In some embodiments, the substrate carrier apparatus 300 includes a carrier plate 402 and a mask assembly 304 disposed above the carrier plate 402. As depicted in FIG. 4, the carrier plate 402 includes a support surface 406 to support a substrate 408. In some embodiments, the carrier plate 402 is formed of a non-metallic material such as, for example, alumina, silicon, etc. In some embodiments, the support surface 406 may be textured to minimize or substantially prevent the substrate 408 from moving along the support surface 406 during handling of the substrate carrier apparatus 300. The mask assembly 304 is disposed above the support surface 406 and includes an annular frame 302 disposed atop the support surface 406 and a shadow mask 306 coupled to the annular frame 302. As used herein, the term annular is not limited to circular closed shapes and may include other closed shapes such as, for example, rectangular, polygonal, etc. In some embodiments, the annular frame 302 includes a radially inward extending lip 412, which is coupled to the shadow mask 306. The shadow mask 306 is disposed within the annular frame 302 such that the shadow mask 306 sits directly above the substrate 408.

The shadow mask 306 includes one or more openings 308 arranged in a predetermined pattern and disposed through the shadow mask 306 to selectively allow material to be deposited through the one or more openings 308 onto the substrate 408 at positions corresponding to the one or more openings 308. In some embodiments, as shown in FIG. 3, the mask assembly 304 includes one or more magnets 310 disposed on an upper surface of the shadow mask 306 to create a magnetic field at least between an upper surface of the shadow mask 306 and an upper surface of the substrate 408. In some embodiments, the one or more magnets 310 may be disposed on a lower surface of the shadow mask 306 or embedded in the shadow mask 306. In some embodiments, the one or more magnets 310 may be disposed on or embedded in the annular frame 302. In some embodiments, the one or more magnets 310 are permanent magnets. In some embodiments, the one or more magnets 310 are electromagnets.

In some embodiments, the shadow mask 306 further includes a plurality of spacer elements (not shown) extending from a bottom surface of the shadow mask 306 to maintain a predetermined gap between the shadow mask 306 and the substrate 408. In some embodiments, the shadow mask 306 may alternatively include an annular spacer (not shown) instead of a plurality of spacers. In some embodiments, the shadow mask 306 has a thickness between about 20 μm and about 50 μm.

In some embodiments, as shown in FIG. 4, the carrier plate 402 includes one or more magnets 414 embedded in the carrier plate 402 to create a magnetic field at least between an upper surface of the shadow mask 306 and an upper surface of the substrate 408. In some embodiments, the one or more magnets 414 may be disposed on an upper surface or lower surface of the carrier plate 402. In some embodiments, the one or more magnets 414 of the carrier plate 402 and the one or more magnets of the mask assembly 304 together create a desired magnetic field configured to advantageously align magnetic domains of magnetic materials deposited onto the substrate in a desired orientation. In some embodiments, the desired orientation is a uniaxial orientation. In some embodiments, the desired orientation includes multiple orientations at angles to each other or multiple orientations to define a curve. In some embodiments, the one or more magnets 414 are permanent magnets. In some embodiments, the one or more magnets 414 are electromagnets.

In some embodiments, a flexure element 410 is disposed between the carrier plate 402 and the mask assembly 304. In some embodiments, as shown in FIG. 4, a first end of the flexure element 410 is coupled to the annular frame 302 and a second end of the flexure element 410 is coupled to the carrier plate 402. In some embodiments, the flexure element 410 may be disposed between and coupled to the annular frame 302 and the shadow mask 306. In some embodiments, the flexure element 410 includes elastomeric members. In some embodiments, the flexure element 410 is a Y-shaped elastic material that serves to control the contact between the mask assembly 304 and the carrier plate 402. In some embodiments, the flexure element 410 includes a plurality of springs. Substrates (e.g., substrate 408) typically have thickness variations across the substrate. The flexure element 410 advantageously compensates for such thickness variations by allowing for a scenario in which the shadow mask 306 is not perfectly horizontal.

During deposition, the shadow mask 306 may undergo thermal expansion and, as a result, may begin to sag. As such, in some embodiments, the shadow mask 306 may include one or more protrusions extending from the bottom surface to compensate for such sagging. The one or more protrusions are arranged at predetermined locations and configured to prevent deflection of the hard mask towards the substrate 408 beyond a predetermined deflection.

Figure 5:
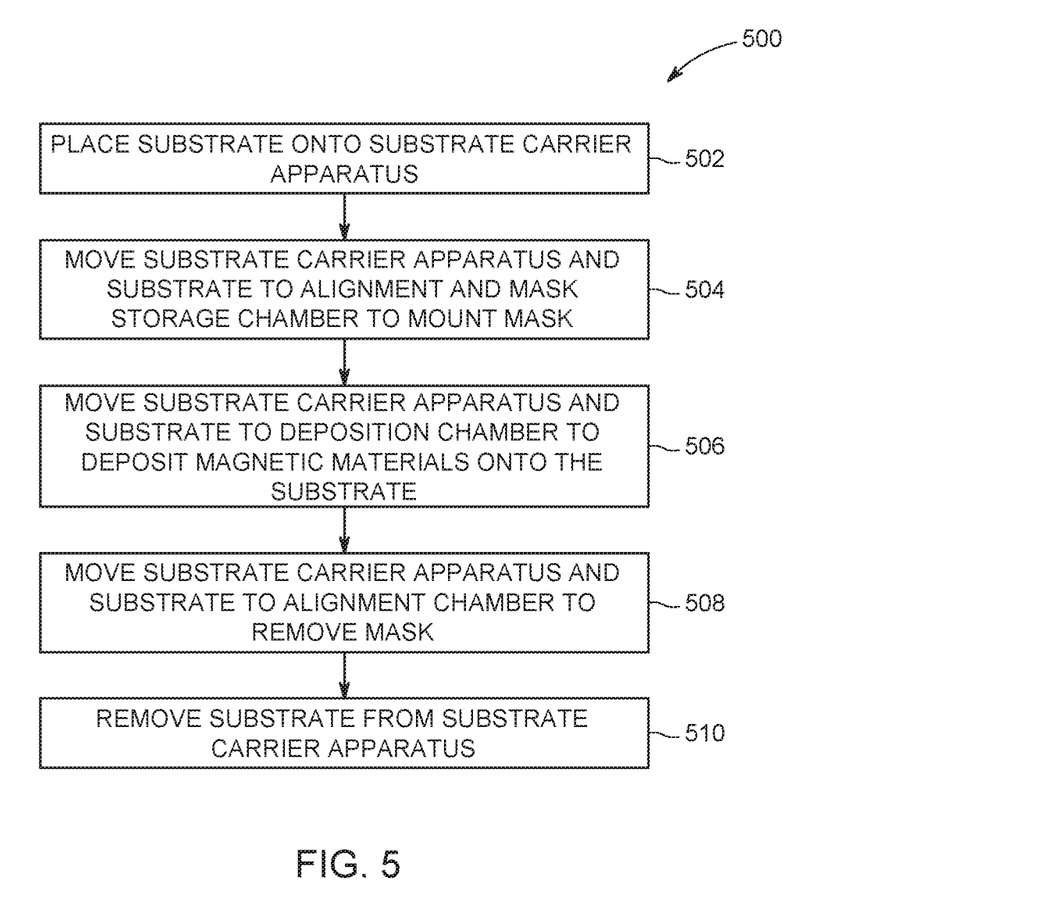
FIG. 5 depicts a method of forming an inductor in accordance with some embodiments of the present disclosure.

FIG. 5 depicts a method of forming an inductor in accordance with some embodiments of the present disclosure. The method 500 starts at 502 by placing a substrate on a support surface of a substrate carrier apparatus. In some embodiments, the substrate is electrostatically clamped to the support surface. In some embodiments, the substrate is placed on the support surface in a factory interface of a multi-chamber processing system (e.g., factory interface 104 of multi-chamber processing system 100).

At 504, the substrate and substrate carrier apparatus is moved to an alignment and mask storage chamber to mount and align a shadow mask to the substrate carrier apparatus. The substrate carrier apparatus, including the shadow mask, is previously magnetized to create a desired magnetic field. In some embodiments, the carrier plate and the shadow mask may be magnetized to opposite poles so that the shadow mask is attracted to the carrier plate and the magnetic field exerted on the magnetic material being deposited is greater.

At 506, the substrate carrier apparatus and the substrate are moved to a deposition chamber to deposit magnetic materials onto the substrate. The magnetic field created by the substrate carrier apparatus is configured to align magnetic domains of magnetic material as the magnetic material is deposited onto the substrate in a desired magnetic pattern. In some embodiments, the magnetic material is deposited onto the substrate through the shadow mask via sputter in a PVD chamber (e.g., chamber 200). In some embodiments, the deposited magnetic material forms a magnetic core or a magnetic cladding of an inductor. In some embodiments, the deposited magnetic material forms a magnetic core or a magnetic cladding of a toroidal inductor. In some embodiments, layers of magnetic materials are deposited onto the substrate with a layer of dielectric material deposited onto the substrate between layers of magnetic materials. The dielectric material may comprise silicon oxide ($SiO_2$), aluminum oxide ($AlO_2$), aluminum nitride (AlN), or oxidized magnetic material. In some embodiments, the layer of magnetic material may be about 100 to about 500 nanometers thick. In some embodiments, the layer of dielectric material may be about 20 to about 50 nanometers thick. In some embodiments, about 3 layers to about 30 layers of magnetic material and dielectric material may be deposited onto the substrate.

At 508, the substrate carrier apparatus and the substrate are moved to the alignment and mask storage chamber to remove the shadow mask. At 510, the substrate is removed from the substrate carrier apparatus. In some embodiments, the substrate is removed from the substrate carrier apparatus in the factory interface.

While the foregoing is directed to embodiments of the present disclosure, other and further embodiments of the disclosure may be devised without departing from the basic scope thereof.

The invention claimed is:

1. A substrate carrier apparatus, comprising:
a carrier plate having a support surface to support a substrate;
a mask assembly disposed above the support surface, wherein the mask assembly includes an annular frame and a shadow mask disposed within the annular frame, wherein the annular frame includes a lip extending radially inwardly and an inner portion of the lip is coupled to an outermost portion of the shadow mask, wherein a radially inner surface of the lip is sloped in a radially inward and downward direction, and wherein the shadow mask includes one or more openings arranged in a predetermined pattern and disposed through the shadow mask; and
one or more magnets disposed on or embedded within at least one of the carrier plate or the shadow mask to create a magnetic field above the support surface.

2. The substrate carrier apparatus of claim 1, wherein the one or more magnets are disposed on or embedded within the shadow mask.

3. The substrate carrier apparatus of claim 1, wherein the one or more magnets provide a magnetic field strength at a substrate surface level above the support surface of about 10 Oersteds to about 5000 Oersteds.

4. The substrate carrier apparatus of claim 1, wherein the carrier plate and the shadow mask are magnetized to opposite poles.

5. The substrate carrier apparatus of claim 1, further comprising a flexure element including elastomeric members or a plurality of springs and having a first end coupled to the annular frame and a second end coupled to the carrier plate, the flexure element configured to compensate for thickness variations of the substrate.

6. The substrate carrier apparatus of claim 1, wherein the magnetic field is substantially perpendicular to the support surface at a substrate surface level above the support surface.

7. The substrate carrier apparatus of claim 1, wherein the support surface is configured to support the substrate having a given diameter and wherein the outermost sidewall of the shadow mask has a diameter less than the given diameter.

8. The substrate carrier apparatus of claim 1, wherein an upper surface of the carrier plate is substantially planar.

9. The substrate carrier apparatus of claim 1, wherein a lowermost surface of the annular frame is disposed vertically above the support surface.

10. A process chamber, comprising:
a chamber body covered by a lid;
a target disposed within the chamber body adjacent the lid;
a substrate support disposed within the chamber body opposite the target; and
a substrate carrier apparatus retained on the substrate support, wherein the substrate carrier apparatus includes a carrier plate having a support surface to support a substrate and a shadow mask disposed above the carrier plate and within an annular frame, wherein the annular frame includes a lip extending radially inwardly and an inner portion of the lip is coupled to an outermost portion of the shadow mask, wherein a radially inner surface of the lip is sloped in a radially inward and downward direction, and wherein one or more magnets are disposed on or embedded within the substrate carrier apparatus to create a magnetic field above the support surface.

11. The process chamber of claim 10, wherein the carrier plate and the shadow mask are magnetized to opposite poles.

12. The process chamber of claim 10, wherein the one or more magnets provide a magnetic field strength at a substrate surface level above the support surface of about 10 Oersteds to about 5000 Oersteds.

13. The process chamber of claim 10, wherein the substrate carrier apparatus comprises the annular frame coupled to the carrier plate and the shadow mask.

14. The process chamber of claim 10, wherein the magnetic field is substantially perpendicular to the support surface at a substrate surface level above the support surface.

15. A substrate carrier apparatus, comprising:
a carrier plate having a support surface to support a substrate, wherein the support surface is textured to minimize the substrate from moving along the support surface;
a mask assembly disposed above the support surface, wherein the mask assembly includes an annular frame and a shadow mask disposed within the annular frame, wherein the annular frame includes a lip extending radially inwardly and an inner portion of the lip is coupled to an outermost portion of the shadow mask, and wherein the shadow mask includes one or more openings arranged in a predetermined pattern and disposed through the shadow mask; and
one or more magnets disposed on or embedded within at least one of the carrier plate or the shadow mask to create a magnetic field above the support surface.

16. The substrate carrier apparatus of claim 15, wherein a radially inner surface of the lip is sloped in a radially inward and downward direction.

17. The substrate carrier apparatus of claim 15, wherein the lip of the annular frame and the carrier plate are configured to support the substrate therebetween.

18. The substrate carrier apparatus of claim 15, wherein the substrate has a given diameter and wherein the shadow mask has an outer diameter less than the given diameter.

19. The substrate carrier apparatus of claim 15, wherein the carrier plate and the shadow mask are magnetized to opposite poles.

20. The substrate carrier apparatus of claim 15, further comprising a flexure element including elastomeric members or a plurality of springs and having a first end coupled to the annular frame and a second end coupled to the carrier plate, the flexure element configured to compensate for thickness variations of the substrate.

\* \* \* \* \*